(12) United States Patent
Chang et al.

(10) Patent No.: US 7,564,285 B2
(45) Date of Patent: Jul. 21, 2009

(54) CONTROLLABLE DELAY LINE AND REGULATION COMPENSATION CIRCUIT THEREOF

(75) Inventors: Chia-Wei Chang, Taichung County (TW); Yeong-Jar Chang, Taichung County (TW)

(73) Assignee: Faraday Technology Corp., Hsin-Chu (TW)

( * ) Notice: Subject to any disclaimer, the term of this patent is extended or adjusted under 35 U.S.C. 154(b) by 29 days.

(21) Appl. No.: 11/754,783

(22) Filed: May 29, 2007

(65) Prior Publication Data

US 2008/0186072 A1 Aug. 7, 2008

(30) Foreign Application Priority Data

Feb. 7, 2007 (TW) ............................... 96104474 A

(51) Int. Cl.
*H03H 11/26* (2006.01)
(52) U.S. Cl. .................. 327/276; 327/264; 327/278; 327/285
(58) Field of Classification Search ......... 327/262–264, 327/276–278, 283–285, 290
See application file for complete search history.

(56) References Cited

U.S. PATENT DOCUMENTS 6,054,884 A * 4/2000 Lye ............................. 327/269

6,316,987 B1 * 11/2001 Dally et al. .................. 327/538
6,859,081 B2 * 2/2005 Hong et al. .................. 327/175

OTHER PUBLICATIONS

Mohammad Maymandi-Nejad et al. "A Monotonic Digitally Controlled Delay Element" IEEE Journal of Solid-State Circuits, vol. 40, No. 11, Nov. 2005, pp. 2212-2219.
Mohammad Maymandi-Nejad et al. "A Digitally Programmable Delay Element: Design and Analysis" IEEE Transactions on Very Large Scale Integration (VLSI) Systems, vol. 11, No. 5, Oct. 2003, pp. 871-878.

* cited by examiner

*Primary Examiner*—An T Luu
(74) *Attorney, Agent, or Firm*—Winston Hsu

(57) ABSTRACT

A controllable delay line includes an anti-jitter unit, a dependent current source, a first current mirror, a second current mirror, a regulation capacitor, a compensation capacitor and an output buffer unit. The anti-jitter unit receives a first bias voltage and produces a second bias voltage based on the first bias voltage. When the voltage source used in the controllable delay line has a variation, the second bias voltage varies therewith. The regulation capacitor is used for reducing the variation of the voltage difference between the voltage source and a node voltage of the first current source. The compensation capacitor is used for reducing the influence of a transition of the input signal of the output buffer unit on the node voltage, so as to lower the jitter amount of the output signal of the output buffer unit.

8 Claims, 5 Drawing Sheets

CONTROLLABLE DELAY LINE AND REGULATION COMPENSATION CIRCUIT THEREOF

CROSS-REFERENCE TO RELATED APPLICATION

This application claims the priority benefit of Taiwan application serial no. 96104474, filed Feb. 7, 2007. All disclosure of the Taiwan application is incorporated herein by reference.

BACKGROUND OF THE INVENTION

1. Field of the Invention

The present invention relates to a controllable delay line.

2. Description of Related Art

Delay lines can be used in many applications, such as in phase-locked loops, delay-locked loops or time interval measuring. In addition, delay lines can be used in jitter measuring of PLL or DLL as well.

Controllable delay lines in the conventional design, however, are vulnerable by power voltage variation and have higher design cost, limited operation speed and limited maximum delay.

Based on the above-mentioned situation, such a controllable delay line is preferred that any influence caused by power voltage variation would be reduced and the operation speed and the maximum delay thereof would be increased.

SUMMARY OF THE INVENTION

Accordingly, the present invention is directed to provide a controllable delay line able to reduce the influence of a power voltage variation on the bias voltage source thereof.

The present invention is further directed to provide a controllable delay line able to reduce the influence of a power voltage variation on the jitter of an output signal.

The present invention is further yet directed to provide a controllable delay line able to increase the operation speed and the maximum delay thereof.

As embodied and broadly described herein, the present invention provides. The present invention provides a controllable delay line, which includes an anti-jitter unit, a first current mirror, a first current mirror, a second current mirror, an output buffer unit and a compensation capacitor. The anti-jitter unit receives a first bias voltage source and produces a second bias voltage source. When a power voltage variation occurs, the anti-jitter unit makes the second bias voltage source varied therewith. The output buffer unit is coupled to the first current mirror and the second current mirror, and has a plurality of input stage buffers. The compensation capacitor is coupled between the first current mirror and an input stage buffer of the output buffer unit.

The present invention further provides a regulation compensation circuit suitable for a controllable delay line, wherein the controllable delay line includes a first current source and an output buffer unit, while the regulation compensation circuit includes a regulation capacitor and a compensation capacitor. The regulation capacitor is for reducing a variation of the voltage between a voltage source and a node of the first current source. The compensation capacitor is coupled between the node of the first current source and the output buffer unit. When an input signal of the output buffer unit gets a transition, the compensation capacitor can reduce the influence of the transition on the voltage of the node so as to reduce the jitter amount of the output signal of the output buffer unit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In order to better understand the present invention, an embodiment thereof is exemplarily described in detail as the following.

In the present invention, an anti-jitter unit is employed to increase the circuit reliability and reduce the jitter amount. In addition, a compensation capacitor is employed to reduce the jitter amount of the output signal and a regulation capacitor is employed to reduce the voltage variation inside the circuit.

Figure 1:
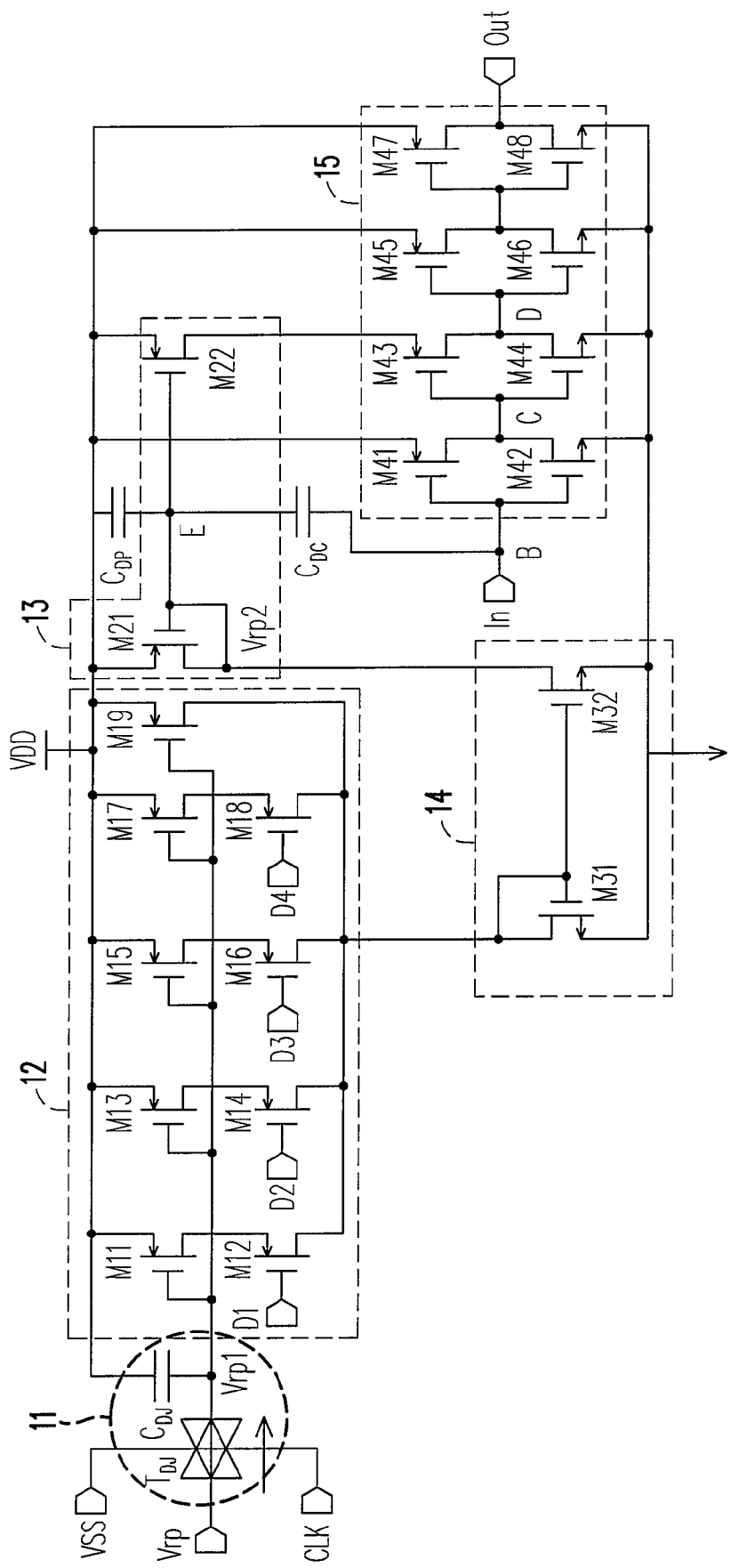
FIG. 1 is a circuit diagram of a controllable delay line according to an embodiment of the present invention.

FIG. 1 is a circuit diagram of a controllable delay line according to an embodiment of the present invention. As shown by FIG. 1, the controllable delay line of the present embodiment includes an anti-jitter unit 11, a dependent current source 12, current mirrors 13 and 14, a regulation capacitor $C_{DP}$, a compensation capacitor $C_{DC}$ and an output buffer unit 15.

The anti-jitter unit 11 includes a transmission gate $T_{DJ}$ and a capacitor $C_{DJ}$. When a voltage source VDD has a variation (for example, ±10% variation), the anti-jitter unit 11 enables a bias voltage source Vrp1 to be varied therewith so as to increase the circuit reliability and reduce the jitter amount. Another bias voltage source Vrp can be produced by a bandgap reference circuit or a digital-to-analog converter (DAC). The more operation details and the circuit principle of the anti-jitter unit 11 would be explained later referring to FIG. 2. Besides, the capacitor $C_{DJ}$ can be a metal-oxide-semiconductor capacitor (MOS capacitor).

The transmission gate $T_{DJ}$ determines the on/off states of the PMOS transistor (not shown) and the NMOS transistor (not shown) therein according to a clock signal CLK. The value of the bias voltage source Vrp1 is related to the voltage source VDD and the bias voltage source Vrp.

The dependent current source 12 includes transistors M11-M19, wherein the wirings of the transistors M11-M19 are shown in FIG. 1 and omitted to describe herein. In addition, a plurality of control signals D1-D4 are respectively input to the gates of the transistors M12, M14, M16 and M18. The control signals D1-D4 are for controlling the delay of the delay line.

The current mirror 13 includes transistors M21 and M22, wherein the wirings of the transistors M21 and M22 are shown in FIG. 1 and omitted to describe herein. A source/ drain of the transistor M22 is coupled to the second stage of the output buffer unit 15, not to the input stage of the output buffer unit 15.

The current mirror 14 includes transistors M31 and M32, wherein the wirings of the transistors M31 and M32 are shown in FIG. 1 and omitted to describe herein.

The regulation capacitor $C_{DP}$ is for reducing voltage variation between the voltage source VDD and a node voltage Vrp2 at node E of the first current source, wherein the wirings of the regulation compensation circuit $C_{DP}$ are shown in FIG. 1 and omitted to describe herein.

The compensation capacitor $C_{DC}$ is for reducing the influence of the input signal In on the node voltage Vrp2 of the node E so as to reduce the jitter amount of the output signal Out, wherein the wirings of the compensation capacitor $C_{DC}$ are shown in FIG. 1 and omitted to describe herein. The capacitor $C_{DJ}$ can be a MOS capacitor.

The output buffer unit 15 includes transistors M41-M48, wherein the paired transistors form an inverter. That is to say, the output buffer unit 15 includes a plurality of inverters in series connection. The wirings of the transistors M41-M48 are shown in FIG. 1 and omitted to describe herein.

Figure 2:
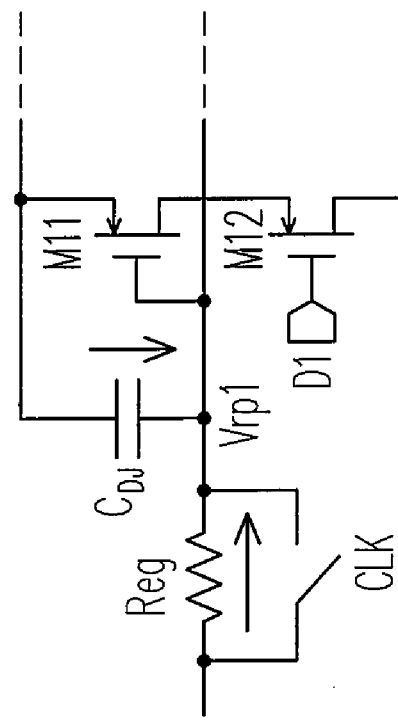
FIG. 2 is a diagram showing the design principle of an anti-jitter unit and the equivalent circuit thereof.
Figure 2:
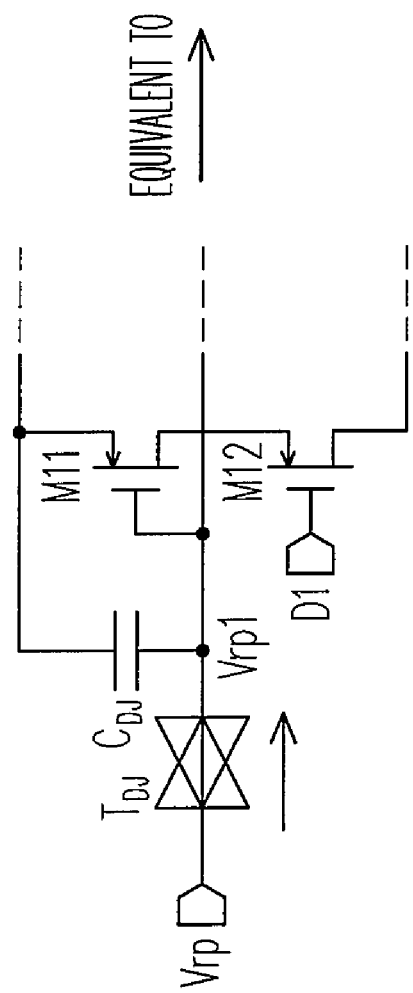

FIG. 2 is a diagram showing the design principle of the anti-jitter unit and the equivalent circuit thereof. Referring to FIG. 2, since the leakage current and the gate-source voltage drop Vgs are to be fixed, the PMOS transistor and the NMOS transistor inside the transmission gate would be simultaneously turned on whenever the controllable delay line of the embodiment is started up, so that a correct Vrp value can be introduced. Once the controllable delay line runs normally, the NMOS transistor is off, but the PMOS transistor remains to be on. When the NMOS transistor is off, the equivalent model thereof can be referred as a large resistance Req; furthermore, the size of the PMOS transistor can be appropriately adjusted to make the ON equivalent resistance thereof not too small. Thanks to the large equivalent resistance Req, the bias voltage source Vrp can be coupled to the bias voltage source Vrp1 through the leakage current, so that distortion of the voltage Vrp1 caused by the leakage current at the gate terminals of the transistors M11, M13, M15, M17 and M19 can be solved.

In order to solve the problem that the level of the voltage Vrp1 is affected by the leakage current between the transmission gate $T_{DJ}$ and the capacitor $C_{DJ}$, the component dimensions of the transmission gate $T_{DJ}$ and the capacitor $C_{DJ}$ will be accordingly adjusted in design.

Figure 3:
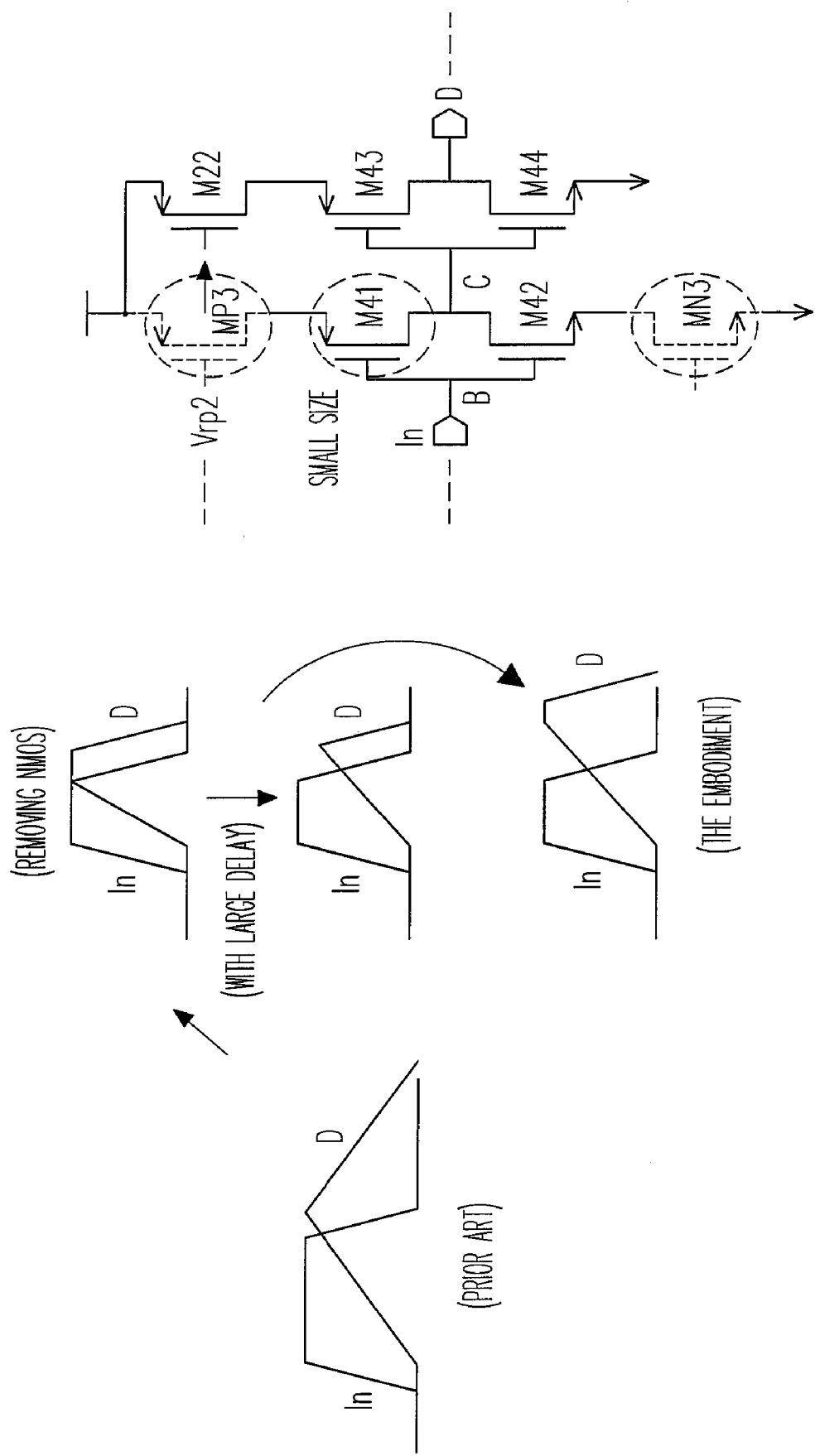
FIG. 3 is a diagram illustrating how the maximum delay and the maximum operable frequency are increased in the present embodiment.

FIG. 3 is a diagram illustrating how the present embodiment increases the maximum delay and the maximum operable frequency. A conventional controllable delay line usually includes a pair of PMOS transistor MP3 and NMOS transistor MN3 (indicated by dashed line circles in FIG. 3). By controlling the gate voltages of the NMOS transistor MM3 and the PMOS transistor MP3, from the output signal Out, rising edges and falling edges of the input signal In is observed. It is clear that falling edges of the output signal are fixed due to the presence of the NMOS transistor MN3, which would limit the maximum delay and the maximum operable frequency of the circuit.

In the controllable delay line of the present embodiment, if only the rising edge variation is to be considered, the NMOS transistor MM3 is removed to reduce the circuit area. On the other hand, the falling edge of the output signal can be shifted back if the transistor M41 has a small size. In this way, the maximum delay and the maximum operable frequency of the circuit are increased. For example, the maximum operable frequency is increased from 2.5 GHz to 2.778 GHz, which is equivalent to an 11.1% increase.

In addition, the PMOS transistor MP3 is coupled to the first stage of the output buffer unit in the prior art; but in the present embodiment, the PMOS transistor M22 with the similar function is coupled to the second stage of the output buffer unit, which can further enhance the adjustment effect.

Figure 4:
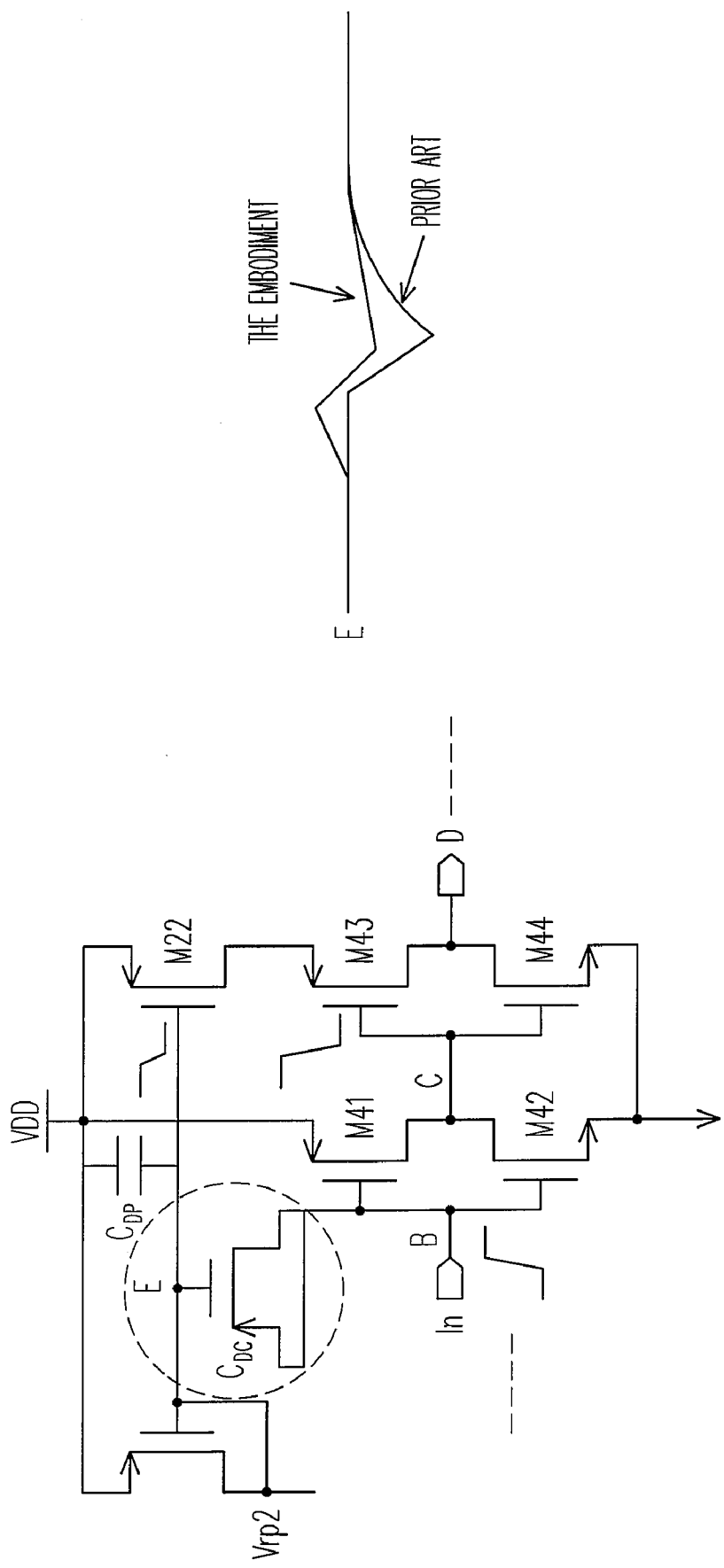
FIG. 4 is a diagram illustrating the effect of a compensation capacitor $C_{DC}$ and a regulation capacitor $C_{DP}$.

FIG. 4 is a diagram illustrating the effect of the compensation capacitor $C_{DC}$ and the regulation capacitor $C_{DP}$. Assuming the circuit had no the compensation capacitor $C_{DC}$, when the input signal In (at the node B) transits from a logic-low state to a logic-high state, the level at the node C would transit from a logic-high state to a logic-low state, which makes the gate voltage (at the node E) of the transistor M22 unstable accompanying an increasing jitter amount.

In the embodiment however, the compensation capacitor $C_{DC}$ is added between the node B and the node E, so as to reduce the influence of the input signal In on the voltage of the node E and to reduce the jitter amount of the output signal Out.

In consideration of an influence of process variation, if the voltage source VDD has, for example, ±10% variation (assuming VDD=1.0V), the jitter amount of the output signal Out will be affected by the voltage variation. The minimum delay of the output signal Out will be occurred corresponding to VDD=1.1V, which is denoted by T (VDD$_{1.1V}$); The maximum delay of the output signal Out will be occurred corresponding to VDD=0.9V, which is denoted by T (VDD$_{0.9V}$). Thus, the jitter amount J_OUT of the output signal can be defined as $$J\_OUT = T(VDD_{0.9V}) - T(VDD_{1.1V}).$$

In the embodiment, the compensation capacitor $C_{DC}$ is disposed between the voltage Vrp2 (the voltage at the node E) and the input signal to reduce the influence of the variation of the voltage source VDD on the output signal.

In general speaking, the coupling charge in the input signal In, coupled to the node voltage Vrp2 via the compensation capacitor $C_{DC}$, is related to the level of the voltage source. The higher the level of the voltage source, the greater the coupling charge is and vice versa.

In this way, the jitter of the output signal can be reduced by the compensation function of the compensation capacitor $C_{DC}$. The following table gives out simulation results.

| D1-D4 | In Prior Art | $C_{DC}$ | Improvement Rate | $C_{DJ}$ & $T_{DJ}$ | Improvement Rate | In The Embodiment | Improvement Rate |
|---|---|---|---|---|---|---|---|
| [1111] | 0.135 | 0.040 | 70.37% | 0.179 | −32.59% | 0.023 | 82.96% |
| [1110] | 0.555 | 0.383 | 30.99% | 0.620 | −11.71% | 0.190 | 65.77% |
| [1101] | 0.673 | 0.521 | 22.59% | 0.636 | 5.50% | 0.562 | 16.49% |
| [1100] | 0.782 | 0.753 | 3.71% | 0.538 | 31.20% | 0.503 | 35.68% |
| [1011] | 0.804 | 0.657 | 18.28% | 0.781 | 2.86% | 0.354 | 55.97% |
| [1010] | 0.747 | 0.525 | 29.72% | 0.595 | 20.35% | 0.438 | 41.37% |
| [1001] | 0.728 | 0.542 | 25.55% | 0.474 | 34.89% | 0.271 | 62.77% |
| [1000] | 0.533 | 0.423 | 20.64% | 0.384 | 27.95% | 0.362 | 32.08% |
| [0111] | 0.417 | 0.315 | 24.46% | 0.337 | 19.18% | 0.309 | 25.90% |

-continued

| D1-D4 | In Prior Art | $C_{DC}$ | Improvement Rate | $C_{DJ}$ & $T_{DJ}$ | Improvement Rate | In The Embodiment | Improvement Rate |
| --- | --- | --- | --- | --- | --- | --- | --- |
| [0110] | 0.389 | 0.336 | 13.62% | 0.126 | 67.61% | 0.363 | 6.68% |
| [0101] | 0.344 | 0.339 | 1.45% | 0.025 | 92.73% | 0.245 | 28.78% |
| [0100] | 0.340 | 0.317 | 6.76% | 0.021 | 93.82% | 0.237 | 30.29% |
| [0011] | 0.335 | 0.254 | 24.18% | 0.018 | 94.63% | 0.233 | 30.45% |
| [0010] | 0.326 | 0.235 | 27.91% | 0.292 | 10.43% | 0.228 | 30.06% |
| [0001] | 0.332 | 0.256 | 22.89% | 0.012 | 96.39% | 0.223 | 32.83% |
| [0000] | 0.280 | 0.278 | 0.71% | 0.313 | −11.79% | 0.219 | 21.79% |

In the table, '$C_{DC}$' represents the jitter amounts when the compensation capacitor $C_{DC}$ is added only; '$C_{DJ}$ & $T_{DJ}$' represents the jitter amounts when the anti-jitter unit is added only. It can be seen from the table that on the whole the jitter amounts are reduced with an average improvement rate of 40%.

Since the signal at the node D and the input signal In are in the same phase, thus, in another embodiment of the present invention, the compensation capacitor $C_{DC}$ can be coupled between the node E and the node D as well. FIG. 4 is a diagram illustrating voltage variation at the node E respectively in the prior art and in the present embodiment.

Figure 5:
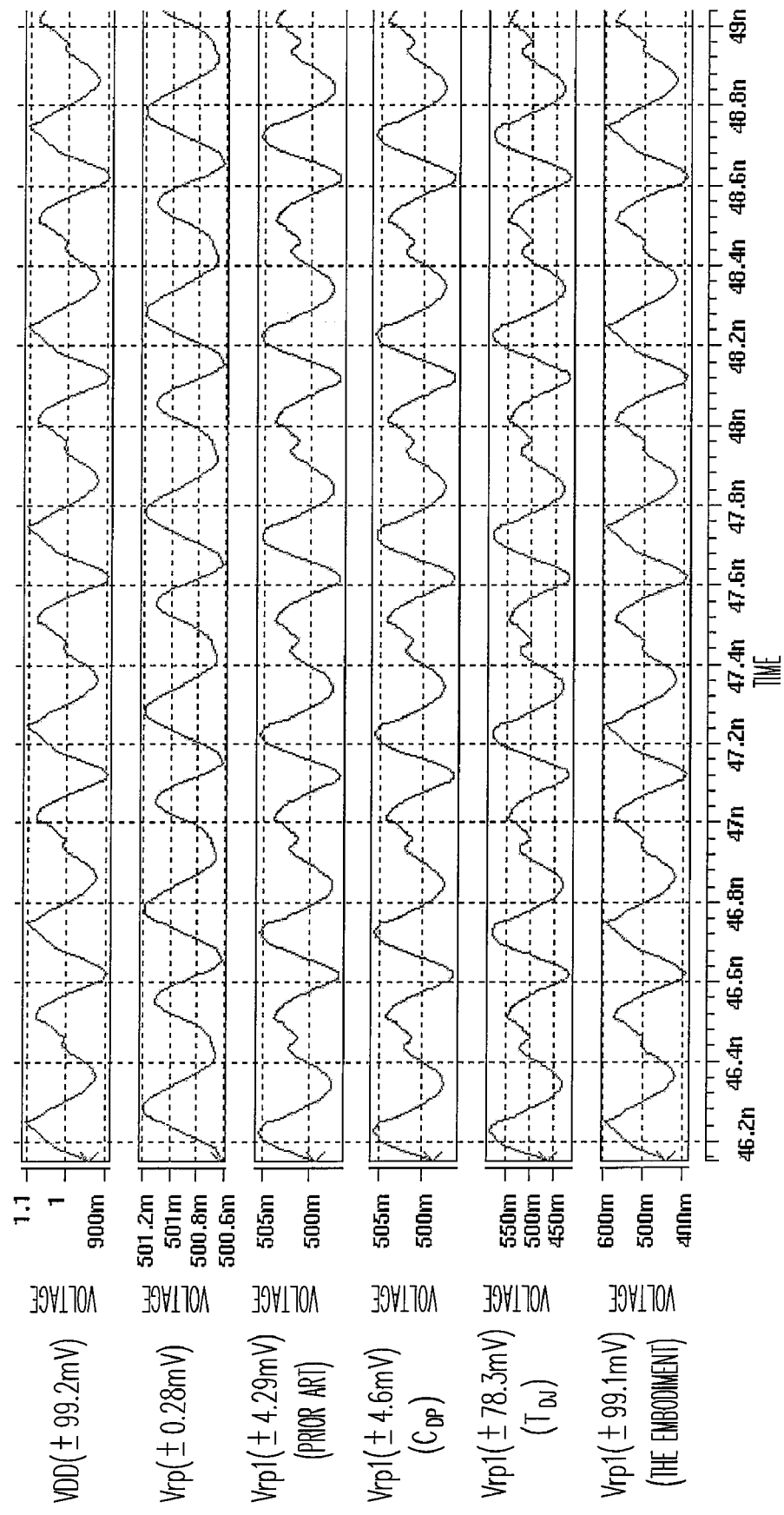
FIG. 5 is a graph showing the simulation result of the present embodiment.

FIG. 5 is a graph showing the simulation result of the present embodiment where the simulation of the node voltage Vrp1 is conducted based on ±99.2 mV variation of the voltage source VDD (VDD=1V, assuming ±10% relative variation).

It can be seen from FIG. 5 that in the prior art, Vrp1 is nearly unchanged even if the variation of VDD (the variation of Vrp1 is ±4.29 mV), which means the voltage difference between VDD and Vrp1 is not fixed under the same control signals so that the jitter of the output signal is increased.

When the capacitor $C_{DJ}$ or the transmission gate $T_{DJ}$ are disposed, Vrp1 would be slightly varied with VDD, wherein the variations of Vrp1 are respectively ±4.6 mV ($C_{DJ}$) and ±78.3 mV ($T_{DJ}$).

In the present embodiment, the value of Vrp1 is varied with VDD by ±99.1 mV. That is to say the voltage difference between VDD and Vrp1 in the embodiment is fixed, which enables the jitter of the output signal reduced.

In summary, by using an anti-jitter unit, the bias voltage Vrp1 would be varied even if variation of the voltage source, which can increase the circuit reliability and reduce the jitter amount of the output signal. In addition, by coupling the transistor M22 to the second stage of the output buffer unit and using a small size transistor M41, the maximum delay and the maximum operable frequency are increased. Further, by adding a compensation capacitor, the jitter amount of the output signal can be further reduced. Furthermore, by adding a regulation capacitor, the voltage difference variation between the voltage source and the voltage at the node E can be lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A controllable delay line, comprising:
   an anti-jitter unit, wherein the anti-jitter unit receives a first bias voltage source and produces a second bias voltage source, and when a voltage source for the controllable delay line has a voltage variation, the anti-jitter unit makes the second bias voltage source accordingly varied;
   a dependent current source, coupled to the second bias voltage source and the anti-jitter unit;
   a first current mirror, coupled to the dependent current source;
   a second current mirror, coupled to the first current mirror and the dependent current source;
   an output buffer unit, coupled to the first current mirror and the second current mirror and having a plurality of input stage buffers; and
   a first capacitor, coupled between the first current mirror and one of the input stage buffers of the output buffer unit.

2. The controllable delay line according to claim 1, wherein the anti-jitter unit comprises a transmission gate for producing the second bias voltage source based on the first bias voltage source according to a clock signal.

3. The controllable delay line according to claim 2, wherein the anti-jitter unit comprises a second capacitor coupled between the voltage source and the second bias voltage source.

4. The controllable delay line according to claim 1, further comprising a second capacitor coupled between the voltage source and the first current mirror.

5. The controllable delay line according to claim 1, further comprising a second capacitor coupled between the first current mirror and a third stage of the input stage buffers of the output buffer unit.

6. A regulation compensation circuit, suitable to be used in a controllable delay line, wherein the controllable delay line comprises a first current source and an output buffer unit; the regulation compensation circuit comprising:
   a regulation capacitor, coupled between a voltage source for the regulation compensation circuit and a node voltage of the first current source, for reducing voltage variation between the voltage source and the node voltage; and
   a compensation capacitor, coupled between the node voltage of the first current source and the output buffer unit, wherein when an input signal of the output buffer unit transits, the compensation capacitor reduces the influence of the transition on the node voltage so as to reduce the jitter amount of an output signal of the output buffer unit.

7. The regulation compensation circuit according to claim 6, wherein the output buffer unit comprises a plurality of input stage buffers, and the compensation capacitor is coupled between the node voltage of a first current minor and one of the input stage buffers of the output buffer unit.

8. The regulation compensation circuit according to claim 6, wherein the output buffer unit comprises a plurality of input stage buffers, and the compensation capacitor is coupled between the node voltage of a first current mirror and a third stage of the input stage buffers of the output buffer unit.

* * * * *